(12) United States Patent
Wirth

(10) Patent No.: US 7,145,181 B2
(45) Date of Patent: Dec. 5, 2006

(54) SEMICONDUCTOR CHIP FOR OPTOELECTRONICS

(75) Inventor: Ralph Wirth, Pettendorf-Adlersberg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/476,121

(22) PCT Filed: Apr. 26, 2002

(86) PCT No.: PCT/DE02/01530

§ 371 (c)(1),
(2), (4) Date: May 7, 2004

(87) PCT Pub. No.: WO02/089217

PCT Pub. Date: Nov. 7, 2002

(65) Prior Publication Data

US 2004/0195641 A1 Oct. 7, 2004

(30) Foreign Application Priority Data

Apr. 27, 2001 (DE) .............................. 101 20 703

(51) Int. Cl.
*H01L 33/00* (2006.01)
(52) U.S. Cl. ................. 257/95; 257/99; 257/E33.074
(58) Field of Classification Search ................. 257/95,
257/98, 99, 100, E33.067, E33.068, E33.07,
257/E33.074
See application file for complete search history.

(56) References Cited

U.S. PATENT DOCUMENTS

| 4,214,251 A | 7/1980 | Schairer |
| 4,988,579 A * | 1/1991 | Tomomura et al. ........... 257/78 |
| 5,087,949 A | 2/1992 | Haitz |
| 5,101,454 A * | 3/1992 | Blonder et al. ............... 385/14 |
| 5,528,057 A * | 6/1996 | Yanagase et al. ............ 257/96 |
| 5,696,389 A | 12/1997 | Ishikawa et al. |
| 5,779,924 A | 7/1998 | Krames et al. |
| 5,814,870 A * | 9/1998 | Spaeth ...................... 257/433 |
| 5,926,320 A | 7/1999 | Parkyn et al. |
| 6,335,548 B1 * | 1/2002 | Roberts et al. ............... 257/98 |
| 6,737,681 B1 * | 5/2004 | Koda ........................... 257/98 |
| 2002/0141006 A1 * | 10/2002 | Pocius et al. ................. 359/15 |

FOREIGN PATENT DOCUMENTS

| DE | 27 27 508 A | 1/1979 |
| DE | 27 55 433 A | 6/1979 |
| DE | 197 09 228 A | 9/1997 |
| DE | 199 11 717 A | 9/2000 |
| EP | 0 101 368 A | 2/1984 |
| EP | 0 551 001 A1 | 12/1992 |
| GB | 2 326 023 A | 12/1998 |

(Continued)

OTHER PUBLICATIONS

English translation of JP 2001-28456A.*

(Continued)

*Primary Examiner*—N. Drew Richards
(74) *Attorney, Agent, or Firm*—Cohen, Pontani, Lieberman & Pavane

(57) ABSTRACT

A semiconductor chip, in particular a light-emitting diode, has a substrate (2), on which a sequence of semiconductor layers (3) with an active zone (5) has been applied. Above the sequence of semiconductor layers (3) there is a stepped window layer (6), which is structured in the manner of a Fresnel lens and has with regard to the coupling out of radiation the function of a hemispherical lens (7). This produces a semiconductor chip with particularly high coupling-out efficiency.

12 Claims, 4 Drawing Sheets

FOREIGN PATENT DOCUMENTS

| | | | |
|---|---|---|---|
| JP | 63283174 A | * | 11/1988 |
| JP | 1-42870 | | 2/1989 |
| JP | 02119275 A | | 5/1990 |
| JP | 2001-028456 | | 1/2001 |
| WO | WO 94/27187 | | 11/1994 |
| WO | WO 01 80322 A | | 10/2001 |

OTHER PUBLICATIONS

Oppliger Y., et al., "One-step 3D shaping using a gray-tone mask", Microelectronic Engineering, Bd. 23, pp. 449-454, 1994.

* cited by examiner

US 7,145,181 B2

SEMICONDUCTOR CHIP FOR OPTOELECTRONICS

This is a U.S. national stage of application No. PCT/DE02/01530, filed on 26 Apr. 2002.

This patent application claims the priority of German patent application 10120703.4, the disclosure content of which is hereby incorporated by reference.

FIELD OF THE INVENTION

The invention relates to a semiconductor chip for optoelectronics with a substrate, on which there is arranged a sequence of semiconductor layers with a photon-emitting, active zone and with a following window layer.

The invention also relates to a method for producing a semiconductor chip for optoelectronics in which firstly a sequence of semiconductor layers with an active zone and a following window layer is applied to a substrate.

BACKGROUND OF THE INVENTION

EP 0 551 001 A1 discloses such a semiconductor chip and such a method for producing it. The known semiconductor chip has a light-generating region which is formed on a substrate and on which a thick window layer is located. The thickness of the window layer is dimensioned such that a light beam totally reflected on the upper side of the window layer can reach and/or leave through a side face of the window layer.

A disadvantage of the known semiconductor chip is the great thickness of the window layer, since layers of great thickness can only be epitaxially produced with difficulty. Furthermore, the known window layer only has a high coupling-out efficiency if the critical angle is not too large. However, the semiconductor chips for optoelectronics typically comprise semiconductor material with a refractive index of n=3.5. The substrate in contact with the semiconductor material usually has a refractive index of n=1.5. In this case, the critical angle for total reflection is approximately 26°. This has the consequence that, in the case of semiconductor chips in dice form, typically only approximately 4% of the photons generated couple out from the semiconductor chip.

In DE 199 11 717 A1, it has therefore been proposed to provide a multiplicity of active zones distributed over the semiconductor chip, over each of which a hemispherical radiation coupling-out element is arranged. This semiconductor chip offers the advantage that the radiation coupling-out elements have the ideal form best suited for coupling out, that is the form of a Weierstrass sphere. Furthermore, not too great a thickness is required for the layer from which the hemispherical radiation coupling-out elements are produced.

However, a disadvantage of the known semiconductor chip is that the contacting of the active zones is relatively complex, since the contacting takes place laterally on the hemispherical radiation coupling elements.

Finally, U.S. Pat. No. 5,087,949 A discloses a semiconductor chip in which the substrate itself has the function of a window layer. The substrate has laterally beveled side faces, so that a light beam emanating from an active zone impinges on the side face as far as possible at an angle of incidence which is smaller than the critical angle for total reflection. However, this solution cannot be applied in every case, since suitable substrates are often not available.

SUMMARY OF THE INVENTION

One object of the invention is to provide a semiconductor chip with a coupling-out efficiency that is as high as possible.

This and other objects are attained in accordance with one aspect of the invention directed to a semiconductor chip for optoelectronics with a substrate, on which there is arranged a sequence of semiconductor layers with a photon-emitting active zone and with a following window layer. The window layer is structured in one region in the manner of a Fresnel lens, so that in the region radiation emitted from the active zone impinges on interfaces of the window layer with respect to the surrounding medium that are inclined toward the active zone.

The forming of the structured window layer or the Fresnel-like lens arranged over the active zone allows the thickness of the window layer to be kept relatively small. In spite of the low height of the Fresnel-like lens or the step-structured window layer, the latter can perform the function of a lens with any desired cross-sectional profile, that is also a hemispherical lens ideal for coupling out, in particular with regard to the angles at which the rays emitted by the active zone impinge on the interface between the window layer and the surrounding medium. In spite of the low overall height, high coupling-out efficiencies can therefore be expected in the case of the semiconductor chip according to the invention.

Another aspect of the invention is directed to a method for producing a semiconductor chip for optoelectronics, in which firstly a semiconductor layer with an active zone and a following window layer is applied to a substrate. The method forms a surface of the window layer that is structured in the manner of a Fresnel lens with the following steps:

applying a photoresist layer on the window layer, exposing the photoresist layer with the aid of a gray-scale mask, developing the photoresist layer for forming a structured surface in the photoresist layer, and transferring the surface structure of the photoresist layer onto the window layer lying underneath it with the aid of an anisotropic etching operation.

By exposing the photoresist layer with a gray-scale mask, photoresist structures with beveled flanks can be created. With the aid of this exposing technique it is possible to create on a window layer a photoresist layer with the structured surface similar to a Fresnel lens and to transfer this onto the window layer lying underneath it with the aid of an anisotropic etching process.

BRIEF DESCRIPTION OF THE DRAWINGS

The invention is explained in detail below on the basis of the accompanying drawings, in which.

DETAILED DESCRIPTION OF THE DRAWINGS

Figure 1:
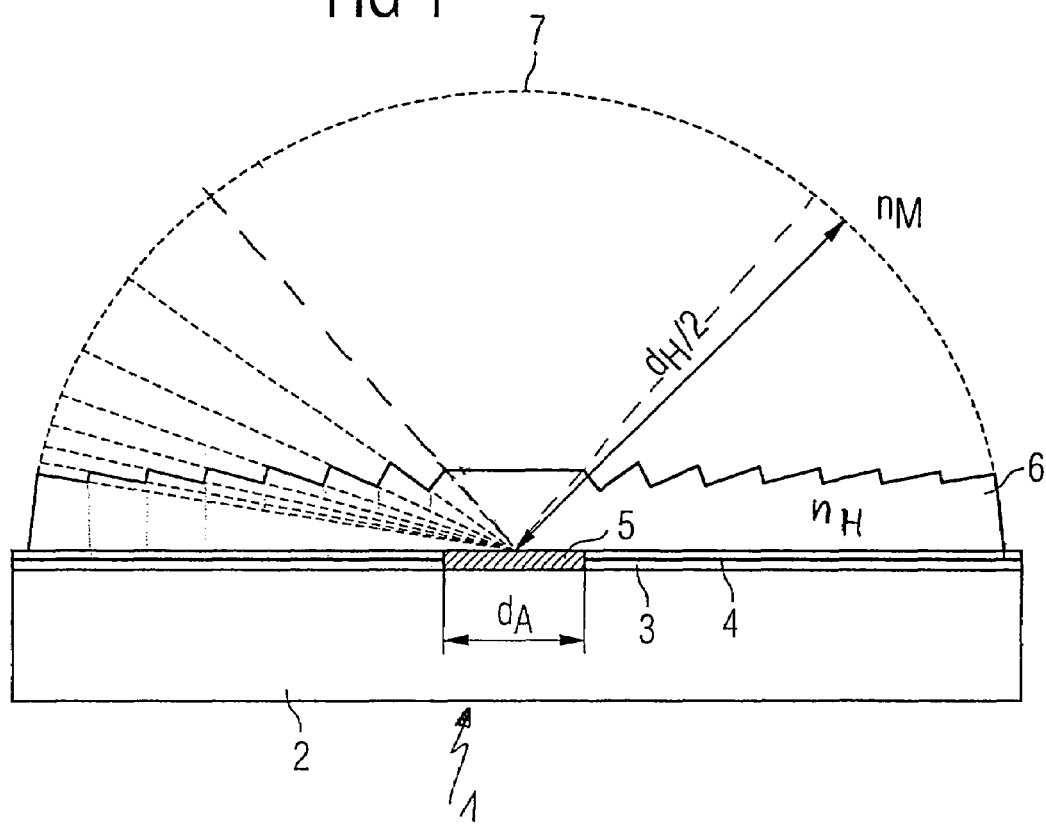
FIG. 1 shows a cross-sectional view through a semiconductor chip for optoelectronics with a structured window layer similar to a Fresnel lens following after an active zone.

FIG. 1 shows a cross section through a semiconductor chip 1, which has a substrate 2, on which a sequence of semiconductor layers 3 with an active layer 4 has been applied. The semiconductor chip represented in FIG. 1 is a semiconductor chip for a light-emitting diode. The photon-emitting region of the active layer 4 is restricted to an active zone 5 with a diameter $d_A$ by suitable screens, not represented in FIG. 1, or by the dimensioning of the contact points, likewise not represented in FIG. 1.

Located above the active zone 5 is a window layer 6. The window layer 6 has the form of a stepped window layer structured in the manner of a Fresnel lens. In the ideal case, the structured window layer similar to a Fresnel lens has with regard to the coupling out of radiation the function of a hemispherical centered lens 7 that is centered on the active zone 5. The term centered lens is to be understood in this connection as meaning that the principal optical axis of the lens passes through the center point of the active zone 5. The cross-sectional profile of this imaginary lens is indicated in FIG. 1 by dashed lines.

According to Weierstrass, all the photons that are generated in the active zone 5 can leave the imaginary lens 7, and consequently in the ideal case the window layer 6, if the following applies:

$$d_A < d_H \times n_M / n_H$$

where $d_H$ and $n_H$ are respectively the diameter and the refractive index of the imaginary lens 7 and of the window layer 6 and $n_M$ is the refractive index of the medium in contact with the lens 7 or the window layer 6. The diameter $d_A$ of the active zone 5 must consequently be less the diameter $d_H$ of the lens 7 reduced in the ratio of the refractive index $n_M$ of the surrounding material to the refractive index $n_H$ of the material of the lens 7. In order to get from the imaginary lens 7 to the structured window layer 6, the cross-sectional profile of the imaginary lens 7 can be projected into the region of the window layer with the aid of a central projection centered on the center point of the active zone 5. The projections of the steps of the window layer onto the active layer 4 can in this case be substantially equidistant in cross section. For the geometrical construction of the a window layer 6 that is thin in comparison with the imaginary lens 7, filled interspaces between pairs of lateral areas of cones, the vertices of which lie on the same point within the active zone and are inscribed of a hemisphere of the diameter $d_H$, can also be projected in a portioned manner in the direction of the center point of the hemisphere.

In this case, the circular segments of the cross-sectional profile of the lens 7 are expediently approximated by triangles, the length of which decreases with increasing gradient with respect to the active layer, so that there is substantially produced a window layer 6 which, apart from the (microscopic) surface structure, macroscopically has a smooth surface. The resulting window layer 6 with the cross section of a polygon then has largely the function of a hemisphere 7 with regard to the coupling out of the radiation generated in the active layer 5.

Figure 2:
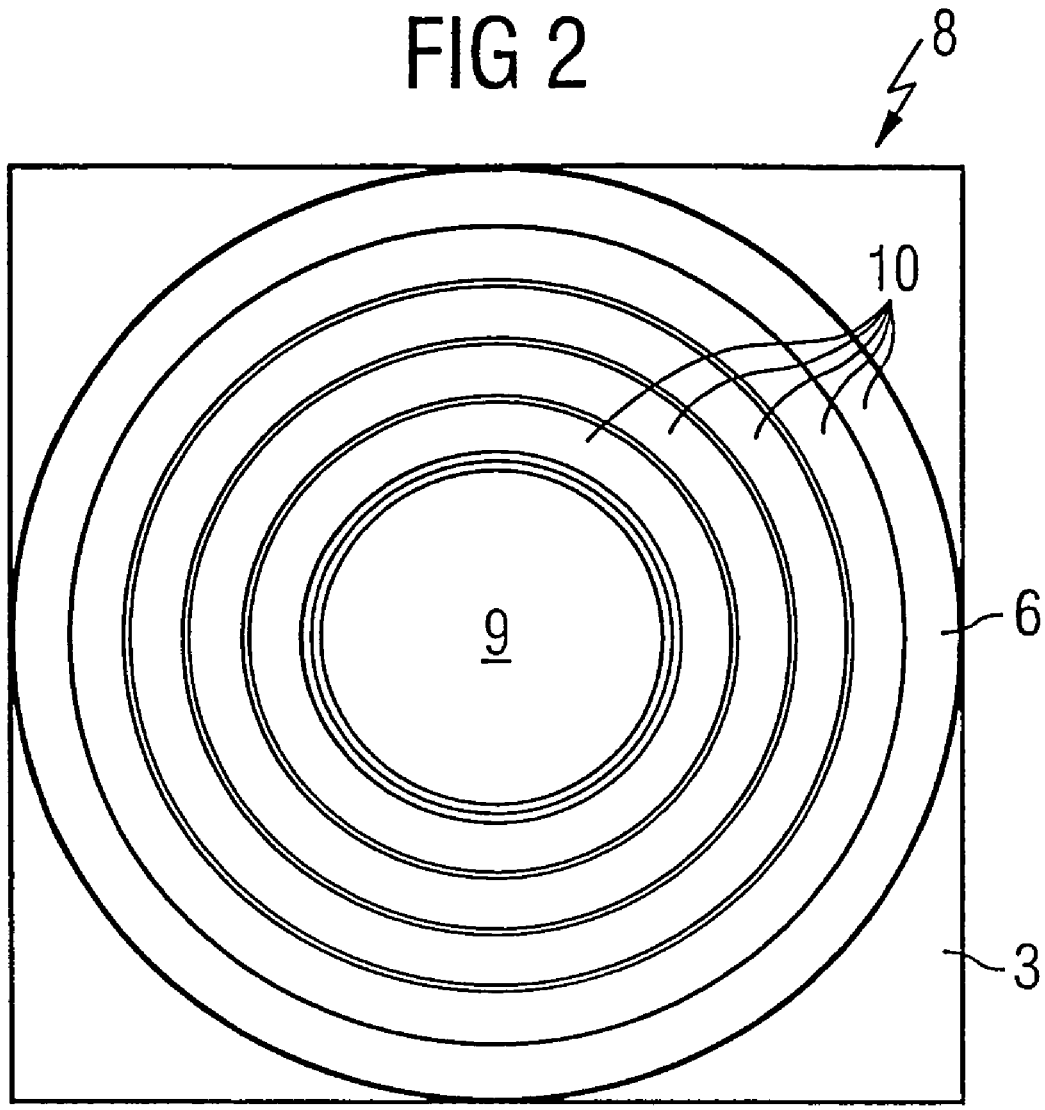
FIG. 2 shows a plan view of a semiconductor chip with a central contact area.
Figure 3:
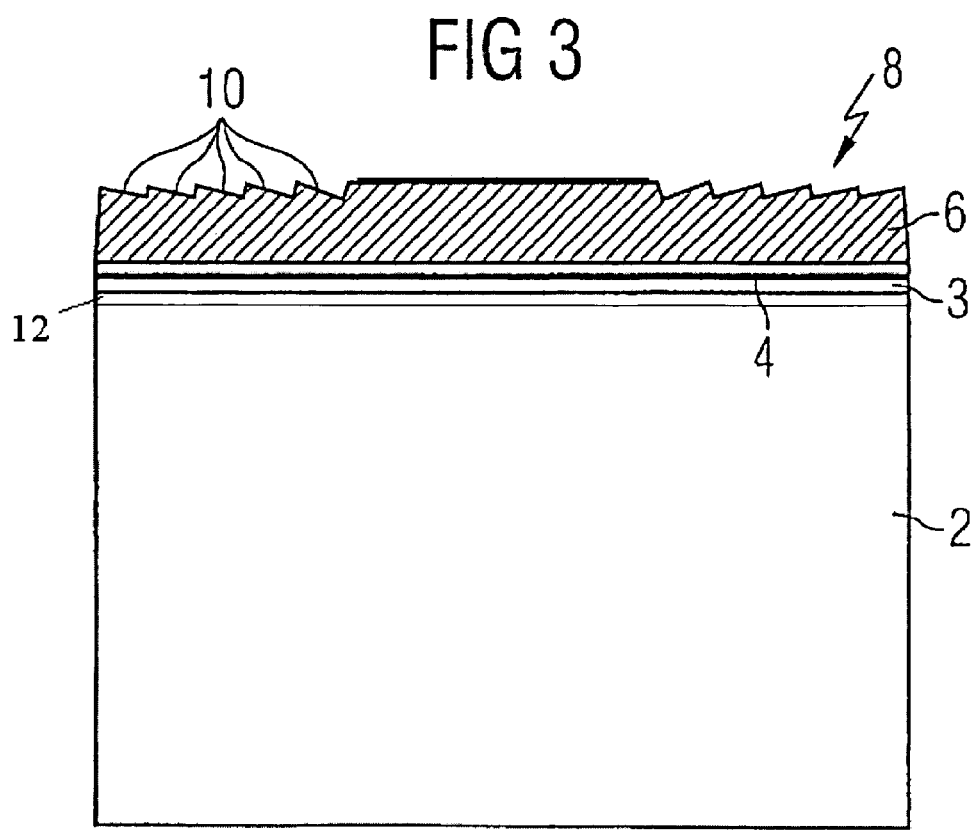
FIG. 3 shows a cross section through the semiconductor chip from FIG. 2.

In FIGS. 2 and 3, a plan view and a cross section through a semiconductor chip formed according to FIG. 1 are represented. The exemplary embodiment represented in FIGS. 2 and 3 is a light-emitting diode 8, on the window layer 6 of which a central contact point 9 is formed.

In order to appreciate the efficiency of the light-emitting diode 8, ray-optical calculations were carried out (raytracing). These yielded values for the coupling-out efficiency of between 20 and 40% if the substrate 2 was considered to have an absorption that is not negligible. Coupling-out efficiency is understood here as meaning the ratio of the number of photons generated in the active zone 5 to the number of photons leaving the light-emitting diode 8. If all the photons generated can leave the light-emitting diode 8, this would result in a coupling-out efficiency of 100%. One of the reasons for the reduced coupling-out efficiency is that the photons emitted into the lower hemisphere are absorbed in the substrate 2. The maximum achievable coupling-out efficiency is therefore 50%. Furthermore, the photons emitted directly upward are shadowed by the contact point 9. Furthermore, the fact that the circular segments which, in the ideal case, form the window layer 6 are approximated to triangles has an effect. This effect is noticeable in particular in the case of the inner rings 10 of the window layer 6. Furthermore, for the inner rings 10, the Weierstrass condition is no longer satisfied with respect to the entire active zone 5, since the active zone 5 is not spherically formed and, depending on the radiating direction, has a different effective diameter $d_A$, which results from the fact that the active zone 5 is projected onto a plane at right angles to the radiating direction. The effective diameter is, however, particularly great for the inner rings 10, so that the Weierstrass condition is not satisfied for the entire active zone 5.

The coupling-out efficiency of the light-emitting diode 8 can be effectively increased by providing a mirror layer between the absorbing substrate 2 and the active layer 4. This mirror layer may be, for example, an epitaxially grown multilayer mirror. However, such a mirror layer can only reflect effectively in a specific angular range. In this case, it is of advantage if the angular range with high reflectance is situated in the region of the shallow light rays. The mirror layer has the virtual effect that the window layer 6 is, as it were, folded downward, so that the photons emitted into the lower hemisphere can also leave the light-emitting diode 8 through the window layer 6. Particularly high coupling-out efficiencies are obtained if a metal layer is used for the mirror layer. In this case, coupling-out degrees of up to 80% can be achieved.

Figure 4:
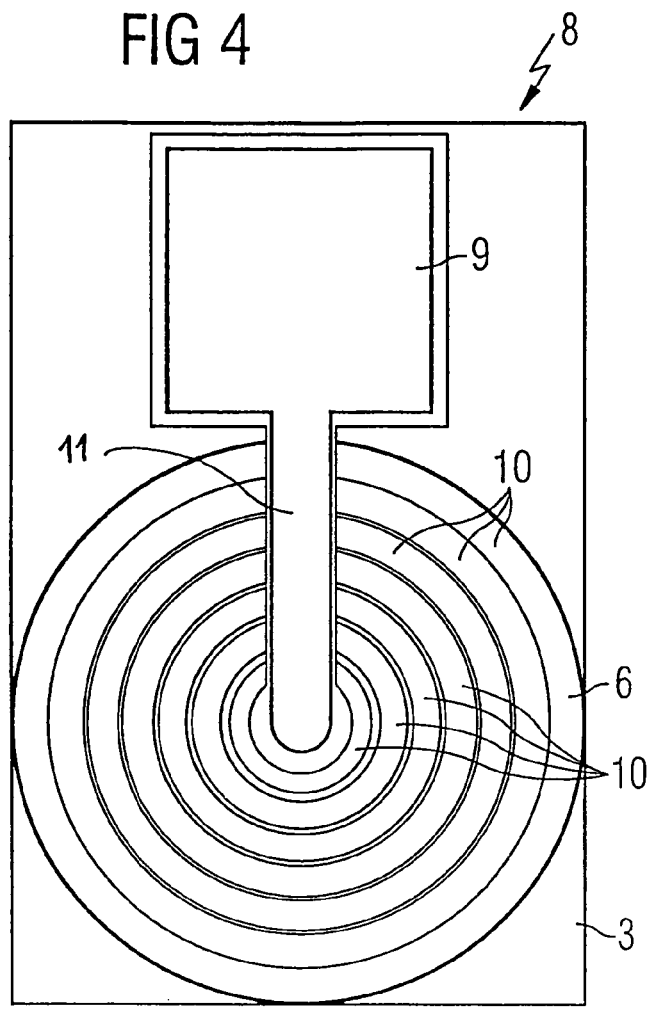
FIG. 4 shows a plan view of a semiconductor chip with a laterally arranged contact area.
Figure 5:
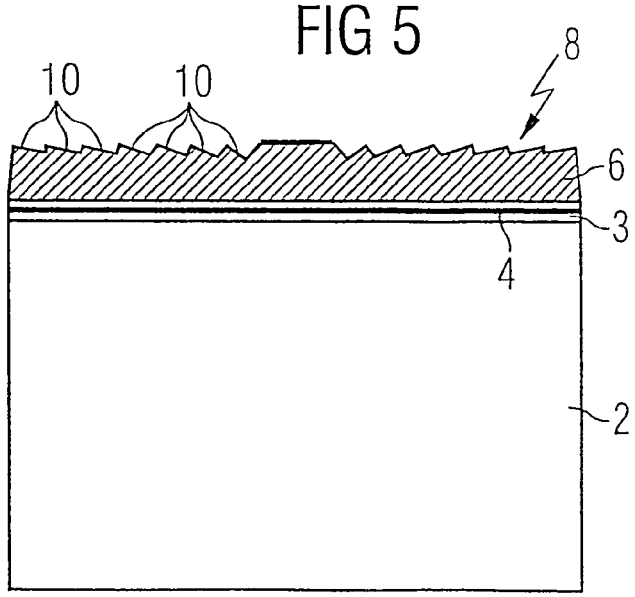
FIG. 5 shows a cross section through the semiconductor chip from FIG. 4.

Furthermore, the coupling-out efficiency can be improved by the coupling point 9 being arranged laterally next to the window layer 6, as represented in FIGS. 4 and 5. In the case of the exemplary embodiment shown, the current is passed through a contact bridge 11 to the center of the window layer 6. The contact bridge 11 is preferably an unstructured region of the window layer 6. When the contact bridge 11 is formed, it must be ensured that an electrical contact with the semiconductor, and consequently also the current injection, takes place only at the center of the window layer 6. This can be achieved, for example, by an insulating intermediate layer between the metal layer of the contact bridge 11 and the semiconductor material of the window layer 6 in the regions in which the current injection is to be prevented. With respect to the structuring of the window layer 6, it should be noted that this is possible in particular by the use of gray-scale masks. For this purpose, after the depositing operation, a photoresist layer is applied to the window layer 6 and exposed with the aid of a gray-scale mask in a way corresponding to the surface structure of the window layer 6. When the photoresist layer is developed, a surface structure which corresponds to the surface structure of the finished window layer 6 is produced. Subsequently, the photoresist layer structured in this way can be transferred into the window layer 6 by an anisotropic etching process.

Reactive ion etching (RIE) comes into consideration in particular for this etching operation.

The invention claimed is:
1. A semiconductor chip for optoelectronics comprising:
a substrate (2);
a sequence of semiconductor layers (3) arranged on and above said substrate and including a photon-emitting active zone (5);
a window layer (6) directly applied to and above said sequence of semiconductor layers;
wherein a region of said window layer (6) has a Fresnel lens type of stepped structure arranged so that in said region of the window layer radiation emitted from the active zone (5) impinges on said stepped structure; and
wherein the semiconductor chip has a central contact point arranged above the active zone (5) on a surface of said window layer not in contact with the sequence of semiconductor layers.

2. The semiconductor chip as claimed in claim 1, wherein steps in said stepped structure in the region of the window layer are respectively portioned projections of surface regions of an imaginary lens (7) in the form of a hemisphere in the direction of its center point, centered on the active zone (5).

3. The semiconductor chip as claimed in claim 2, wherein the following applies for the diameter $d_A$ of the active zone:

$$d_A < d_H \times n_M / n_H$$

where $d_H$ is the diameter of the imaginary hemisphere (7), $n_H$ is the refractive index of the window layer (6) and $n_M$ is the refractive index of the medium in contact with the window layer (6).

4. The semiconductor chip as claimed in claim 2, wherein the structured region of the window layer (6) is approximated in cross section to a polygon.

5. The semiconductor chip as claimed in claim 1, wherein the semiconductor chip has a contact point (9) outside the window layer (6).

6. The semiconductor chip as claimed in claim 1, wherein the central contact point (9) is arranged on a surface of the window layer facing away from the substrate.

7. The semiconductor chip as claimed in claim 1, wherein the window layer is electrically conductive.

8. A semiconductor chip for optoelectronics comprising:
a substrate (2);
a sequence of semiconductor layers (3) arranged on and above said substrate and including a photon-emitting active zone (5);
a window layer (6) directly applied to and above said sequence of semiconductor layers;
wherein a region of said window layer (6) has a Fresnel lens type of stepped structure arranged so that in said region of the window layer radiation emitted from the active zone (5) impinges on said stepped structure;
wherein the semiconductor chip has a central contact point arranged above the active zone (5) and a contact point (9) outside the window layer (6); and
wherein from the contact point (9) a contact bridge (11) leads to the active zone.

9. A semiconductor chip for optoelectronics comprising:
a substrate (2);
a sequence of semiconductor layers (3) arranged on and above said substrate and including a photon-emitting active zone (5);
a window layer (6) directly applied to and above said sequence of semiconductor layers;
wherein a region of said window layer (6) has a Fresnel lens type of stepped structure arranged so that in said region of the window layer radiation emitted from the active zone (5) impinges on said stepped structure;
wherein the semiconductor chip has a central contact point arranged above the active zone (5); and
wherein a reflective layer is arranged between the active zone (5) and the substrate (2).

10. A semiconductor chip for optoelectronics comprising:
a substrate (2);
a sequence of semiconductor layers (3) arranged on and above and above said substrate and including a photon-emitting active zone (5);
a window layer (6) directly applied to and above said sequence of semiconductor layers;
wherein a region of said window layer (6) has a Fresnel lens type of stepped structure arranged so that in said region of the window layer radiation emitted from the active zone (5) impinges on said stepped structure;
wherein the semiconductor chip has a central contact point arranged above the active zone (5); and
wherein a contact bridge is arranged on the surface of the window layer facing away from the substrate.

11. A semiconductor chip for optoelectronics comprising:
a substrate (2);
a sequence of semiconductor layers (3) arranged on said substrate and including a photon-emitting active zone (5);
a window layer (6) directly applied to said sequence of semiconductor layers;
wherein a region of said window layer (6) has a Fresnel lens type of stepped structure arranged so that in said region of the window layer radiation emitted from the active zone (5) impinges on said stepped structure;
wherein the semiconductor chip has a contact point (9) outside the window layer (6); and
wherein from the contact point (9) a contact bridge (11) leads to the active zone.

12. A semiconductor chip for optoelectronics comprising:
a substrate (2);
a sequence of semiconductor layers (3) arranged on said substrate and including a photon-emitting active zone (5);
a window layer (6) directly applied to said sequence of semiconductor layers;
wherein a region of said window layer (6) has a Fresnel lens type of stepped structure arranged so that in said region of the window layer radiation emitted from the active zone (5) impinges on said stepped structure; and
wherein a contact bridge is arranged on the surface of the window layer facing away from the substrate.

* * * * *